United States Patent [19]
Ebitani et al.

[11] Patent Number: 5,438,198
[45] Date of Patent: Aug. 1, 1995

[54] INFRARED-TO-VISIBLE CONVERTER

[75] Inventors: Masuyuki Ebitani; Toshifumi Tominaga, both of Anan; Akihito Kishi, Tokushima, all of Japan

[73] Assignee: Nichia Chemical Industries, Ltd., Tokushima, Japan

[21] Appl. No.: 238,020

[22] Filed: May 3, 1994

[30] Foreign Application Priority Data

May 12, 1993 [JP] Japan ................... 5-110396

[51] Int. Cl.$^6$ ............................................. H01L 31/14
[52] U.S. Cl. .................... 250/330; 250/484.2
[58] Field of Search .............. 250/330, 484.2, 370.11; 257/84

[56] References Cited

U.S. PATENT DOCUMENTS

| | | | |
|---|---|---|---|
| 3,710,127 | 1/1973 | Kohashi et al. | 250/330 |
| 3,800,156 | 3/1974 | Kohashi et al. | 250/330 |
| 5,229,626 | 7/1993 | Ebitani et al. | 257/84 |

FOREIGN PATENT DOCUMENTS 5-45215 2/1993 Japan .
6-37353 2/1994 Japan .
6-45639 2/1994 Japan .
6-45640 2/1994 Japan .

OTHER PUBLICATIONS

A. Kishi et al., "Fabrication and Characterization of Infrared–Into–Visible Converter", Electro–chem. Soc. 183rd Meeting, May 1993–1 Extended Abst. No. 1469.
B. Kazan, "An Electroluminescent Light–Amplifying Picture Panel", Proc. IRE45, 1358 (Journal).

*Primary Examiner*—Carolyn E. Fields
*Attorney, Agent, or Firm*—Wenderoth, Lind & Ponack

[57] ABSTRACT

An IR-to-visible converter for a solid-state image converting device including a photoconductive layer and an electroluminescent layer is sensitive to 1.5 μm region IR rays and can convert such IR rays with high efficiency into visible light perceivable even in a well-lighted room. The IR-to-visible converter is characterized by using an IR to visible upconversion phosphors layer which has emission peaks in the sensitive wavelength region of the photoconductor layer, the IR to visible upconversion phosphors layer being optically combined with photoconductive layer.

9 Claims, 4 Drawing Sheets

INFRARED-TO-VISIBLE CONVERTER

BACKGROUND OF THE INVENTION

1. Field of Invention

The present invention relates to an infrared-to-visible converter having combined photoconductive and infrared upconversion phosphors layers, which is used for a solid state image converting device for converting an image of infrared (IR) rays into a visible light image, and more particularly, to an IR-to-visible converter for converting 1.5 μm region IR rays into visible light, such 1.5 μm region IR rays being important in the field of optical fiber communication systems.

2. Description of the Related Art

Recently, the use of 1.5 μm region IR rays, especially in optical fiber communication systems, has increased together with an increasing power of laser diodes in the near-IR region, that is, from 0.7 to 1.5 μm. Infrared upconversion phosphors (IUP) consisting of fluoride or chloride containing $Er^{3+}$ is notable as a material for converting 1.5 μm region IR rays into visible light directly. However, a conventional IR converter having IUP only is an up-conversion type device and its conversion efficiency is very low. Since the input intensity of IR rays is usually low, the output visible light of the conventional IR converter is perceivable only in such places as a darkroom.

On the other hand, Japanese Patent Application No. 4-197897 describes a solid-state image converting device for converting a radiation image of IR rays into a visible light image which is perceivable even in a well-lighted room. The device includes a photoconductive (PC) layer and an electroluminescent (EL) layer. However, since the PC layer consists of particles of CdSe compound, the detectable wavelength ranges from 750 nm to 1050 nm, and the problem with this type of solid-state image converting device that is not sensitive to 1.5 μm region IR rays which are widely used in optical fiber communication systems.

Accordingly, a need exists for an IR-to-visible converter which is sensitive to 1.5 μm region IR rays and can convert such IR rays into visible light perceivable even in a well-lighted room.

SUMMARY OF INVENTION

In view of the foregoing, it is an object of this invention to provide an IR-to-visible converter used for a solid image converting device which is sensitive to 1.5 μm region IR rays and converts such IR rays with high efficiency into visible light which is perceivable even in a well-lighted room.

To achieve this object of the invention, the inventors through research efforts have developed the idea of incorporating IUP into the above-described solid state image converting device consisting of a PC layer and an EL layer.

The IR-to-visible converter of the present invention is characterized by utilizing an IUP layer which is optically combined with a PC layer and emits light, under incident IR rays excitation, in the wavelength regions sensitive to the PC layer.

It is preferable that the IUP layer comprises IUP particles and the PC layer comprises PC particles and that the IUP particles and the PC particles are homogeneously admixed to form a single layer (PC-IUP layer).

The IUP is preferred to have its main emission peaks in the sensitive wavelength region of the PC layer.

Hence, the IUP particles preferably consist of halide of rare earth elements or alkaline earth metals activated by $Er^{3+}$.

Furthermore, the PC particles consist of CdSe compounds and the EL layer contains ZnS compound particles. At the same time, the IUP particles consist of yttrium fluoride activated by $Er^{3+}$, wherein the IUP particles are preferably represented by the following general formula: $Y_{1-x}Er_xF_3$ ($x$ is in the range of 0.05 to 0.4).

The IR-to-visible converter of this invention utilizes the IUP for converting IR rays into light emissions in the sensitive wavelength region of the PC particles. The emissions decrease the impedance of the PC layer, and consequently, the EL layer emits visible light. Accordingly, the IR-to-visible converter of this invention converts a radiation image of IR rays into a visible light image which is perceivable with high efficiency even in a well-lighted room.

When incident IR rays are in the sensitive wavelength region of the PC particles, the IR rays decrease the impedance of the PC-IUP layer directly. At the same time, the light emissions from the IUP particles decrease the impedance of the PC-IUP layer further.

In case of the PC particles consisting of CdSe compounds, the EL layer containing ZnS compounds and the IUP particles consisting of yttrium fluoride activated by $Er^{3+}$, the IUP emits 985 nm light and decreases the impedance of the PC layer whose sensitive wavelength ranges from 750 nm to 1050 nm, and the EL layer emits bright visible light with high efficiency.

BRIEF DESCRIPTION OF DRAWINGS

The invention will be better understood by reference to the description which follows taken in connection with the accompanying drawings, in which.

DETAILED DESCRIPTION OF PREFERRED EMBODIMENT

An embodiment of the present invention will be explained with reference to the drawings.

Figure 1:
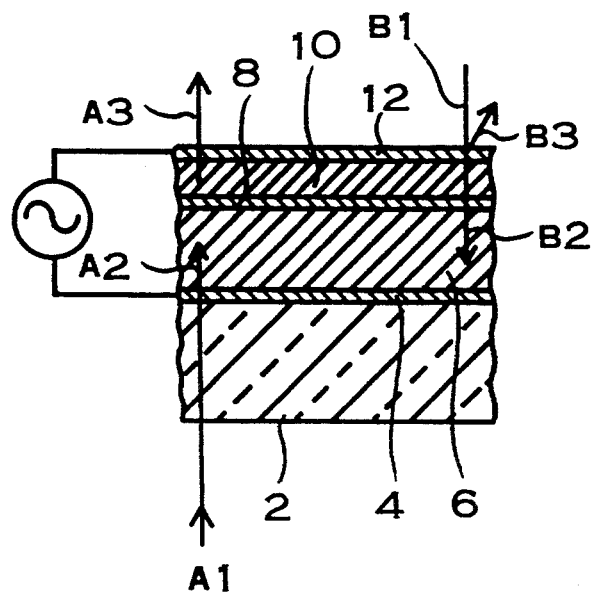
FIG. 1 is a partial section view showing the structure of an IR-to-visible converter according to an embodiment of the present invention.

FIG. 1 is a partial sectional view showing the IR-to-visible converter of the present invention. As shown in FIG. 1, the IR-to-visible converter includes a transparent glass substrate 2 and an indium-tin-oxide (ITO) thin film 4, consisting of indium oxides and thin oxides, formed on the transparent glass substrate 2. On the thin film 4, a PC-IUP layer 6, a dielectric layer 8 consisting of particles of barium titanite, an EL layer 10 consisting of ZnS:Cu,Al and a transparent electrode 12 consisting of ITO fine powder are sequentially laminated. The PC-IUP layer 6 is formed by admixing PC particles of cadmium selenide compounds and IUP particles of $Y_{0.8} Er_{0.2} F_3$ in a 7 to 3 proportion (weight ratio) homogeneously and then dispersing these particles in an organic binder and applying the dispersion on the ITO thin film 4. The ITO thin film 4 and the back transparent electrode layer 12 are connection to an appropriate AC inverter power supply.

The thickness of each layer is, for example, as follows:

the PC-IUP layer 6: 200 μm
the dielectric layer 8: 15 μm
the EL layer 10: 30 μm

This embodiment is characterized by combining the PC layer and the IUP layer into single PC-IUP layer by admixing particles of CdSe compounds and $Y_{0.8} Er_{0.2} F_3$ particles homogeneously.

According to the present invention, as shown by reference A1 in FIG. 1, when a 1.5 μm region IR ray centers from the side of the transparent glass substrate 2, it passes through the ITO thin film 4 and reaches the IUP particles in the PC-IUP layer 6 (indicated by reference A2). As a result, the IUP particles radiate (mainly 985 nm light as described above) and decrease the impedance of the irradiated part of the PC-IUP layer 6. Consequently, electric current flows between the thin film 4 and transparent electrode 12 and through the EL layer 10, whereby the corresponding part of the EL layer 10 emits visible light (indicated by reference A3).

On the other hand, as shown by reference B1 in FIG. 1, when a 1.5 μm region IR ray enters from the side of the back transparent electrode layer 12, it passes through the back transparent electrode 12, the EL layer 10, the dielectric layer 8 and reaches the IUP particles in the PC-IUP layer 6 (indicated by referenced B2). As a result, the IUP particles emit 985 nm light and decrease the impedance of the irradiated part of the PC-IUP layer. Consequently, as described above, the corresponding part of the EL layer 10 emits visible light (indicated by reference B3).

Thus, the IR-to-visible converter of this embodiment of the invention can convert 1.5 μm region IR rays into visible light with high efficiency when they enter not only from the side of the glass substrate 2 (transmission process) but also from the side of the back transparent electrode 12 (reflection process).

The converting efficiency of the IR-to-visible converter will now be discussed with reference to the following examples.

Figure 2:
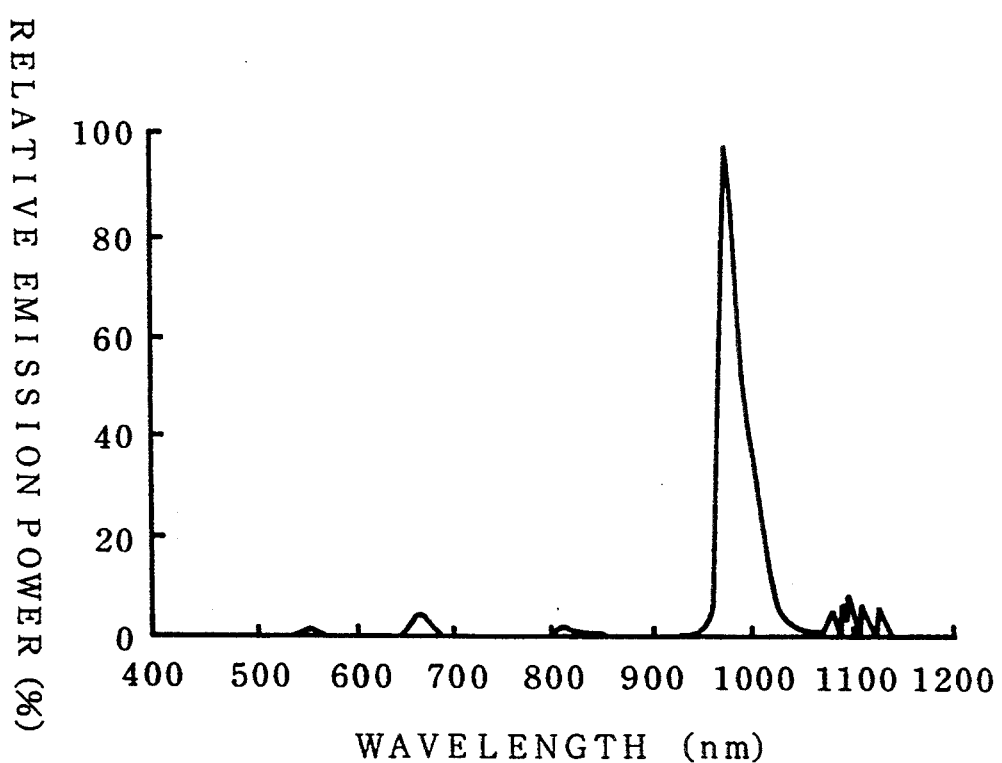
FIG. 2 is a graph showing an IUP fluorescence spectrum according to an embodiment of the present invention.

FIG. 2 shows the fluorescence spectrum of IUP consisting of $Y_{0.3} Er_{0.2} F_3$ under excitation by 1.55 μm IR rays. From FIG. 2, it can be seen that this IUP has its main emission peak at 985 nm.

Figure 3:
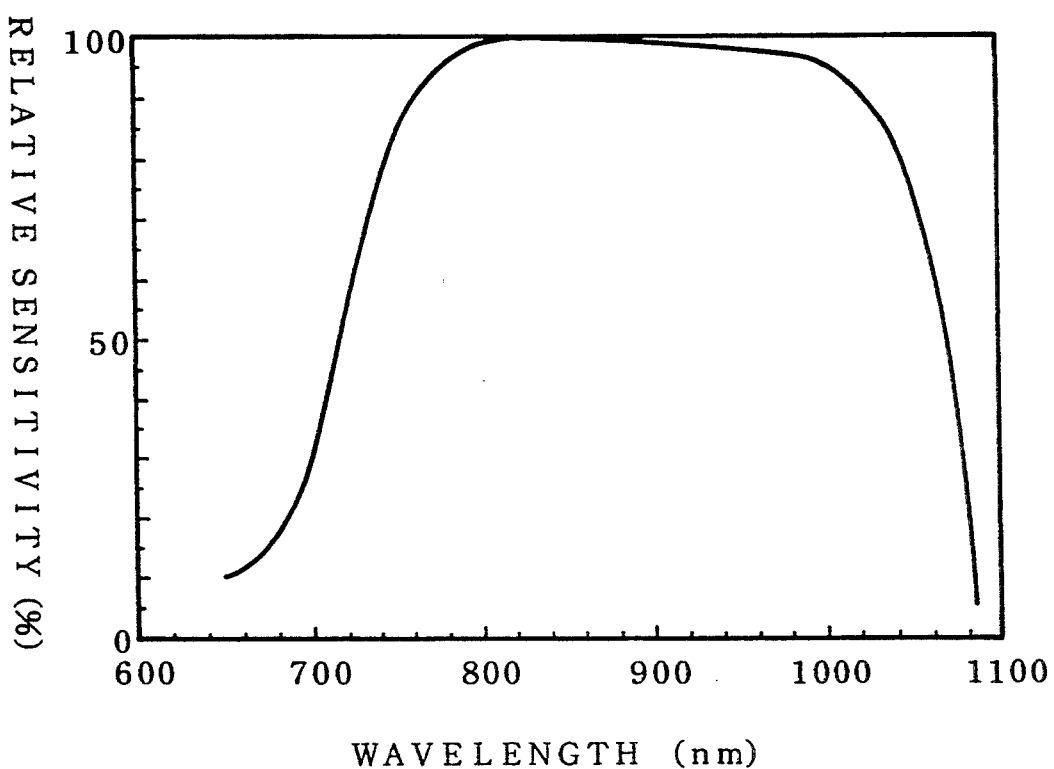
FIG. 3 is a graph showing the sensitivity spectrum of the PC layer according to an embodiment of the present invention.

FIG. 3 shows the spectral spectral of the PC (photoconductor) consisting of particles of CdSe compounds. From FIG. 3, it can be seen that the detectable wavelength ranges from 750 nm to 1050 nm.

Figure 4:
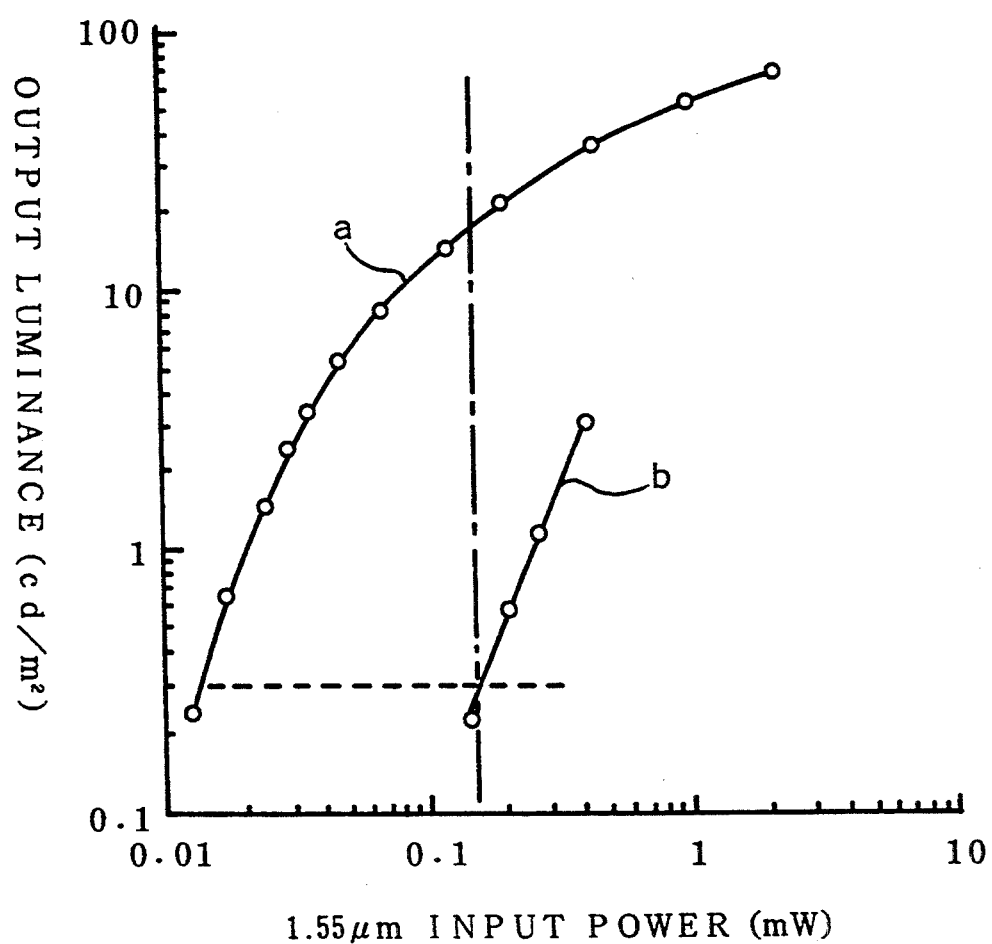
FIG. 4 is a graph showing the relation between IR input power and output luminance for two different types of IR-to-visible converters.

In FIG. 4, the curve "a" shows the relation between IR input power from a 1.55 μm laser diode and output luminance from the EL layer 10, and herein the tip of optical fiber connected to the 1.55 μm laser diode is placed 2 mm apart from the surface of the IR-to-visible converter of this invention using the transmission process. As a comparison, the curve "b" shows a similar type of relation for a conventional IR-to-visible converter consisting of an IUP layer only using the reflection process, where IUP is a fluoride activated by $Er^{3+}$. The minimum brightness necessary for commercial use of an IR-to-visible converter is ca. 0.3 cd/m2. As shown in FIG. 4, output luminance of the IR-to-visible converter of this embodiment is 0.3 cd/m2 under 0.014 mw input power. Since the output luminance of the IUP consisting of yttrium fluoride activated by $Er^{3+}$ is 0.3 cd/m2 under 0.17 mw input power, the sensitivity of the IR-to-visible converter is ca.12 times higher than that of the conventional device. It is also shown in FIG. 4 that the output luminance is several ten times higher than that of the convectional device under the same input power.

Figure 5:
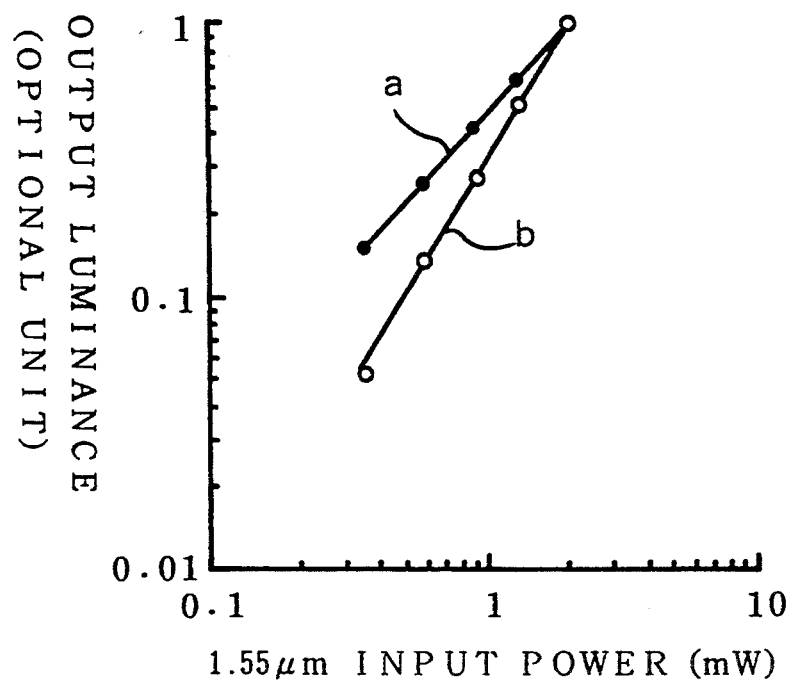
FIG. 5 is a graph showing the relation between input power and output luminance at each emission peak of the IUP according to an embodiment of the present invention.

In FIG. 5, the straight lines "a" and "b" shows the relation between IR input power of a 1.55 μm laser diode and output luminance of 985 nm and 660 nm emitted by IUP represented by $Y_{0.3} Er_{0.2} F_3$, respectively. As shown by the graph, each output luminance decreases with decreasing input power, but the intensity of 985 nm light decreases more gradually than that of 660 nm light. Accordingly, 985 nm light is preferable as the light emission of the IUP in this embodiment.

Figure 6:
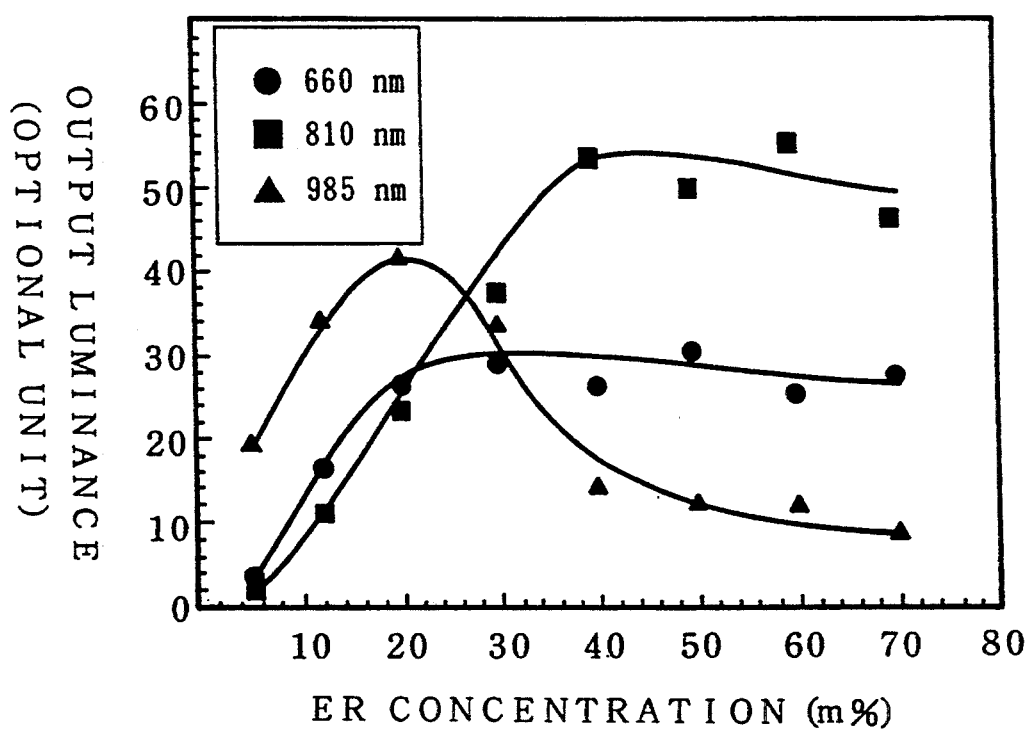
FIG. 6 is a graph showing the relation between the Er concentration of IUP and relative output luminance according to an embodiment of the present invention.

FIG. 6 shows the relation between the Er concentration of the IUP represented by $Y_{1-x} Er_x F_3$ and 660 nm, 810 nm and 985 nm wavelength output luminance under excitation by 1.55 μm IR rays, respectively. As it is read from the graph, appropriate concentration of Er is from 5 to 40 mol % since 985 nm light is used.

Having described a specific embodiment of the invention, it is clear that obvious modifications and variations of the invention are possible in light of the above teachings. For example, while the PC-IUP layer is formed by admixing IUP and PC particles, an IUP layer may be formed independently as a separate layer, such as between the transparent glass substrate 2 and a transparent electrode layer 4. Such a separate ITO layer is formed in the same manner as forming the back transparent electrode 12.

Also, while yttrium fluoride activated by $Er^{3+}$ is used, other IR excitable phosphors which have light emissions in the sensitive wavelength region of the PC particles consisting of cadmium selenide compounds, that is, from 750 nm to 1050 nm, may be used. Examples are halides of rare earth elements or alkaline earth metals activated by Pr or Nd or Tm or Ho, or co-activated by Ho and Yb, or Er and Yb.

As stated above, the IR-to-visible converter of this invention includes the PC layer, the EL layer and the IUP layer and is sensitive to 1.5 μm region IR rays and can convert such rays into visible light even in a well-lighted room. Conversion efficiency and sensitivity of this IR-to-visible converter are much higher than those of IR converters consisting of IUP only.

What is claimed is:

1. An infrared-to-visible converter which converts incident infrared rays into visible light, comprising:
   a photoconductive layer;
   an electroluminescent layer disposed along said photoconductive layer; and,
   an infrared upconversion phosphors layer optically combined with said photoconductive layer;
   wherein a wavelength of a light emission from said infrared upconversion phosphors layer which is responsive to the incident infrared rays is within a sensitive wavelength region of said photoconductive layer.

2. An infrared-to-visible converter as claimed in claim 1, wherein said infrared upconversion phosphors layer comprises infrared upconversion phosphors particles and said photoconductive layer comprises photoconductive particles, and wherein said infrared upconversion phosphors particles and said photoconductive particles are homogeneously admixed to form a single layer as said infrared upconversion phosphors layer optically combined with said photoconductive layer.

3. The infrared-to-visible converter as claimed in claim 2, wherein said infrared upconversion phosphor particles consist of halides of rare earth elements or alkaline earth metals activated by $Er^{3+}$.

4. The infrared-to-visible converter as claimed in claim 1, wherein said photoconductive layer contains particles of cadmium selenide compounds, said electroluminescent layer contains particles of zinc sulfide compounds, and said infrared upconversion phosphor layer contains particles consisting of yttrium fluoride activated by $Er^{3+}$.

5. The infrared-to-visible converter as claimed in claim 2, wherein said photoconductive particles consist of cadmium selenide compounds, said electroluminescent layer contains particles of zinc sulfide compounds, and said infrared upconversion phosphor particles consist of yttrium fluoride activated by $Er^{3+}$.

6. The infrared-to-visible converter as claimed in claim 3, wherein said photoconductive particles consist of cadmium selenide compounds, said electroluminescent layer contains particles of zinc sulfide compounds, and said infrared upconversion phosphor particles consist of yttrium fluoride activated by $Er^{3+}$.

7. The infrared-to-visible converter as claimed in claim 4, wherein said particles of said infrared upconversion phosphor layer are reprsented by $Y_{1-x}Er_xF_3$, where x is in the range of 0.05 to 0.4.

8. The infrared-to-visible converter as claimed in claim 5, wherein said infrared upconversion phosphor particles are represented by $Y_{1-x}Er_xF_3$, where x is in the range of 0.05 to 0.4.

9. The infrared-to-visible converter as claimed in claim 6, wherein said infrared upconversion phosphor particles are represented by $Y_{1-x}Er_xF_3$, where x is in the range of 0.05 to 0.4.

* * * * *